(12) United States Patent
Son et al.

(10) Patent No.: US 9,395,619 B2
(45) Date of Patent: Jul. 19, 2016

(54) PHASE SHIFT MASK, PATTERNING METHOD USING THE SAME AND METHOD OF MANUFACTURING DISPLAY PANEL USING THE SAME

(71) Applicant: Samsung Display Co., LTD., Yongin, Gyeonggi-Do (KR)

(72) Inventors: Yong Son, Suwon-si (KR); Min Kang, Seoul (KR); Bong-Yeon Kim, Seoul (KR); Dong-Eon Lee, Seoul (KR); Jun-Hyuk Woo, Yongin-si (KR); Hyun-Joo Lee, Seoul (KR); Sang-Uk Lim, Yongin-si (KR); Jin-Ho Ju, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 107 days.

(21) Appl. No.: 14/307,797

(22) Filed: Jun. 18, 2014

(65) Prior Publication Data

US 2015/0198872 A1 Jul. 16, 2015

(30) Foreign Application Priority Data

Jan. 14, 2014 (KR) .................. 10-2014-0004566

(51) Int. Cl.
*G03F 1/26* (2012.01)
*G03F 7/40* (2006.01)
*G03F 7/20* (2006.01)

(52) U.S. Cl.
CPC .. *G03F 1/26* (2013.01); *G03F 7/20* (2013.01); *G03F 7/40* (2013.01)

(58) Field of Classification Search
CPC ............... G03F 1/26; G03F 1/34; G03F 1/28; G03F 1/29; G03F 1/30; G03F 1/32; G03F 7/0007; G03F 7/20; G03F 7/40
USPC .................. 430/5, 7, 321, 311, 319, 323, 396
See application file for complete search history.

(56) References Cited

U.S. PATENT DOCUMENTS

| 4,890,309 | A | 12/1989 | Smith et al. |
| 6,472,766 | B2 | 10/2002 | Xiao |
| 2009/0201474 | A1* | 8/2009 | Marokkey ............... G03B 27/42 355/53 |
| 2011/0294045 | A1 | 12/2011 | Nagai et al. |

FOREIGN PATENT DOCUMENTS

| KR | 1020010108999 A | 12/2001 |
| KR | 1020020063960 A | 8/2002 |
| KR | 1020060070967 A | 6/2006 |
| KR | 1020090111684 A | 10/2009 |
| KR | 1020100127110 A | 12/2010 |
| KR | 1020100128172 A | 12/2010 |
| KR | 1020110031558 A | 3/2011 |

OTHER PUBLICATIONS

Computer-generated translation of KR 2006-0070967 (Jun. 2006).*

* cited by examiner

*Primary Examiner* — John A McPherson
(74) *Attorney, Agent, or Firm* — Cantor Colburn LLP

(57) ABSTRACT

A phase shift device includes a phase shift mask which includes a transparent substrate, and a phase shift pattern which is provided on the transparent substrate, and includes a first area having a first thickness, a second area having a second thickness which is less than the first thickness, a first opening having a first opening width and defined at the first area, and a second opening having a second opening width and defined at the second area.

20 Claims, 17 Drawing Sheets

PHASE SHIFT MASK, PATTERNING METHOD USING THE SAME AND METHOD OF MANUFACTURING DISPLAY PANEL USING THE SAME

This application claims priority to Korean Patent Application No. 10-2014-0004566, filed on Jan. 14, 2014, and all the benefits accruing therefrom under 35 U.S.C. §119, the disclosure of which is incorporated by reference herein in its entirety.

BACKGROUND

1. Field

Exemplary embodiments of the invention relate to a phase shift mask, a patterning method using the phase shift mask, and a method of manufacturing a display apparatus using the patterning method.

More particularly, exemplary embodiments of the invention relate to a phase shift mask for manufacturing a display panel, a patterning method using the phase shift mask, and a method of manufacturing a display apparatus using the patterning method.

2. Description of the Related Art

Generally a liquid crystal display ("LCD") apparatus has various advantageous characteristics such as thin thickness, lightweight, low power consumption, etc. Thus, the LCD apparatus has been widely used in various devices such as a monitor, a note personal computer, a cellular phone, etc. The LCD apparatus includes an LCD panel displaying an image by using an optical transmissivity of liquid crystal and a backlight assembly disposed under the LCD panel to provide light to the LCD panel.

SUMMARY

As a resolution of the LCD apparatus increases, higher precision of pattering process may be needed. However, precision of the pattering process may depend on resolving power of an exposure apparatus, or precision of mask. Especially, as a structure of the LCD apparatus becomes complex, uneven thickness of a substrate on which a pattern is formed may cause a problem with the patterning process.

One or more exemplary embodiment of the invention provides a phase shift mask for providing a pattern with improved precision.

One or more exemplary embodiments of the invention also provide a patterning method using the phase shift mask.

One or more exemplary embodiments of the invention also provide a method of manufacturing a display panel using the patterning method.

According to an exemplary embodiment of the invention, a phase shift mask includes a transparent substrate, and a phase shift pattern provided on the transparent substrate. The phase shift pattern includes a first area having a first thickness and a second area having a second thickness which is less than the first thickness. A first opening having a first opening width at the first area and a second opening having a second opening width at the second area are defined in the phase shift pattern.

In an exemplary embodiment, the phase shift pattern may further include phase shift material which changes a phase of light passing through the phase shift pattern.

In an exemplary embodiment, the phase shift material pattern further include chrome oxide nitride (CrOxNy), molybdenum silicide oxide nitride (MoSiOxNy) or a combination of chrome oxide nitride (CrOxNy) and molybdenum silicide oxide nitride (MoSiOxNy). The phase of light passing through the phase shift pattern may be changed by about 180 degrees.

In an exemplary embodiment, the phase shift mask is configured to pattern a substrate, which is an object for pattering disposed under the phase shift mask, may include a first area corresponding to the first opening of the phase shift mask and a second area corresponding to the second opening of the phase shift mask. The second area may be higher than the first area, so that the second area of the substrate is closer to the phase shift mask than the first area.

In an exemplary embodiment, the phase shift pattern may further include chrome oxide nitride (CrOxNy). A difference between the first thickness and the second thickness may be about 0.003 times a height difference of the substrate between the second area and the first area.

In an exemplary embodiment, a thickness of the phase shift pattern between the first area and the second area may gradually change from the first thickness to the second thickness.

In an exemplary embodiment, the phase shift pattern may further include a third area having a third thickness which is less than the second thickness.

In an exemplary embodiment, the first and second openings may be configured to focus light in a photoresist layer of a substrate which is an object for patterning disposed under the phase shift mask.

In an exemplary embodiment, the phase shift mask is configured to pattern a substrate, which is an object for patterning disposed under the phase shift mask, and the first opening width of the first opening of the phase shift mask may be larger than a width of a portion of the substrate upon which light which passes the first opening is irradiated.

In an exemplary embodiment, the phase shift mask is configured to pattern a substrate, which is an object for patterning disposed under the phase shift mask, and the substrate comprises two different thicknesses corresponding to the first and second thicknesses of the phase shift pattern.

In an exemplary embodiment, each of the first opening width and the second opening width of the phase shift pattern may be less than about 2 micrometers (μm).

According to an exemplary embodiment of the invention, a patterning method includes providing a photoresist layer on a substrate, irradiating light to the photoresist layer using a phase shift mask, providing a photoresist pattern by developing the photoresist layer which is irradiated using a developer, providing a first pattern at a first area and a second pattern at a second area by partially etching the substrate, and removing the remaining photoresist pattern. The photoresist layer includes a first area and a second area which is higher than the first area by a second height. The phase shift mask includes a transparent substrate, and a phase shift pattern provided on the transparent substrate, the phase shift pattern including a first area having a first thickness and a second area having a second thickness which is less than the first thickness;

In an exemplary embodiment, a first opening having a first opening width at the first area and a second opening having a second opening width at the second area are defined in the phase shift pattern. The first pattern of the substrate may have a first width. The second pattern of the substrate may have a second width. The first width may be less than the first opening width, and the second width may be less than the second opening width.

In an exemplary embodiment, the irradiating light to the photoresist layer using the phase shift mask may focus light passing the first opening may form a focus in the photoresist layer at the first area, and may focus light passing the second opening in the photoresist layer at the second area.

In an exemplary embodiment, the phase shift pattern of the phases shift mask may further include chrome oxide nitride (CrOxNy), molybdenum silicide oxide nitride (MoSiOxNy) or a combination of chrome oxide nitride (CrOxNy) and molybdenum silicide oxide nitride (MoSiOxNy).

In an exemplary embodiment, the phase shift pattern may include chrome oxide nitride (CrOxNy). A difference between the first thickness and the second thickness may be about 0.003 times the second height.

According to an exemplary embodiment of the invention, method of manufacturing a display panel includes providing a substrate, disposing a black matrix on the substrate, disposing a first color filter having a first height on the substrate, a second color filter having a second height and a third color filter having a third height on which the black matrix is disposed, disposing a conductive layer on the first to third color filters, disposing a photoresist layer on the conductive layer, irradiating light to the photoresist layer using a phase shift mask, providing a photoresist pattern by developing the photoresist layer which is irradiated using a developer, and providing a first electrode on the first color filter, a second electrode on the second color filter, and a third electrode on the third color filter by partially etching the substrate. The phase shift mask includes a transparent substrate, and a phase shift pattern which is provided on the transparent substrate, has a first thickness corresponding to the first color filter, has a second thickness corresponding to the second color filter, and having a third thickness corresponding to the third color filter.

In an exemplary embodiment, the first height of the first color filter may be less than the second height of the second color filter. The third height of the third color filter may be greater than the second height of the second color filter. The first thickness of the phase shift pattern of the phase shift mask may be greater than the second thickness. The third thickness may be less than the second thickness.

In an exemplary embodiment, a plurality of first slit openings corresponding to the first color filter, a plurality of second slit openings corresponding to the second color filter and a plurality of third slit openings corresponding to the third color filter may be defined through the phase shift pattern. The first slit opening may have a first width. The second slit opening may have a second width. The third slit opening may have a third width. A plurality of slits may be defined in the first electrode may include a plurality of slits. The slit may have a first separation distance. A plurality of slits may be defined in the second electrode. The slit may have a second separation distance. A plurality of slits may be defined in the third electrode. The slit may have a third separation distance.

In an exemplary embodiment, each of the first to third line widths and the first to third separation distances may be less than about 2 micrometers (µm).

According to the invention, although a substrate to form a pattern has various thicknesses, a phase shift mask has a phase shift layer having first and second thicknesses different from each other, so that a precise pattern may be provided. Thus, while manufacturing the phase shift mask, a width of opening is not required to be adjusted considering a height difference of the substrate. The height difference of the substrate may be considered by controlling the thickness of the phase shift pattern instead, so that a precise pattern may be provided.

In addition, a photoresist layer is irradiated at a focus area of light passing the phase shift mask, so that precise pattern smaller than an opening width of the phase shift mask may be provided.

BRIEF DESCRIPTION OF THE DRAWINGS

The above and other features of the invention will become more apparent by describing in detail exemplary embodiments thereof with reference to the accompanying drawings, in which.

DETAILED DESCRIPTION

Figure 1A:
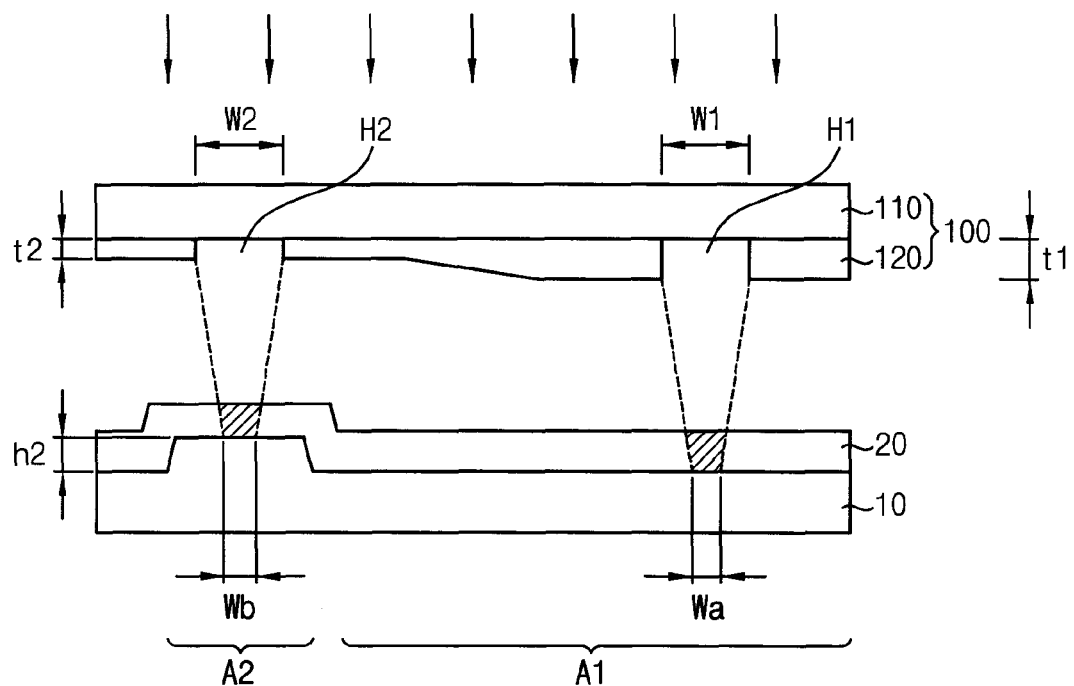
FIGS. 1A to 1C are cross-sectional views illustrating an exemplary embodiment of a patterning method according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, the invention will be explained in detail with reference to the accompanying drawings.

Figure 1B:
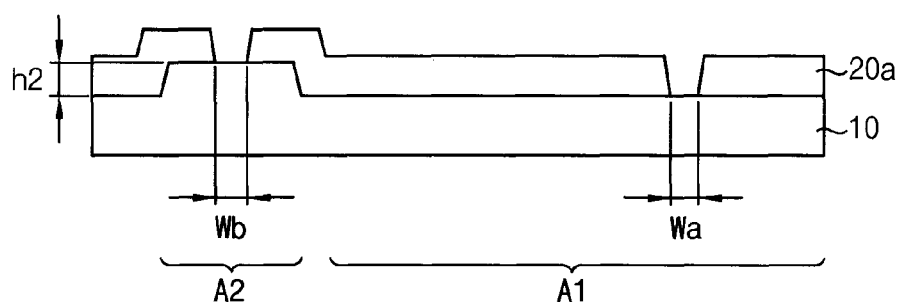
Figure 1C:
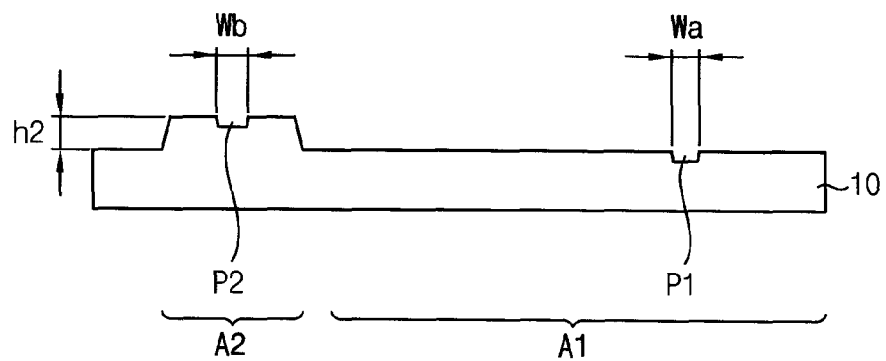

FIGS. 1A to 1C are cross-sectional views illustrating a patterning method according to an exemplary embodiment of the invention.

Referring to FIG. 1A, a phase shift mask 100 is placed on a substrate 10 to face the substrate 10, and then a photoresist layer 20 on the substrate 10 is irradiated by light which passes the phase shift mask 100.

The photoresist layer 20 is disposed on the substrate 10. In an exemplary embodiment, the substrate 10 may includes a base substrate and a metal pattern provided on the base substrate. In an exemplary embodiment, the base substrate may be a transparent insulation substrate including glass and/or plastic, for example. In an exemplary embodiment, the metal pattern may include a thin film transistor ("TFT").

The photoresist layer 20 includes a photoresist composition. The photoresist composition may include a positive photoresist composition in which a portion of the positive photoresist composition that is exposed to light becomes soluble to a developer. In an exemplary embodiment, the photoresist composition may include acid generator, a resin which increase its alkali solubility by an acid-catalyzed reaction, alkali metallic salt and organic solvent.

The substrate 10 has a first area A1, and a second area A2 which is higher than the first area A1 by a second height h2. Thus, the substrate 10 may have two different heights due to the metal pattern on the substrate 10. Accordingly, a height of the photoresist layer 20 in the second area A2 is greater than a height of the photoresist layer 20 in the first area A1. Heights may be taken from a common surface or reference point.

The phase shift mask 100 includes a transparent substrate 110, and a phase shift pattern 120 provided on the transparent substrate 110.

The transparent substrate 110 passes light, and does not change phase of the light. In an exemplary embodiment, the transparent substrate 110 may include quartz, for example.

The phase shift pattern 120 changes phase of light which passes the phase shift pattern 120. In an exemplary embodiment, the phase shift pattern 120 may include phase shift material, such as chrome oxide nitride ($CrO_xN_y$), molybdenum silicide oxide nitride ($MoSiO_xN_y$), a combination of chrome oxide nitride ($CrO_xN_y$) and molybdenum silicide oxide nitride ($MoSiO_xN_y$), and etc. In an exemplary embodiment, the phase shift pattern 120 may change the phase of the light as 180 degree, so that the phase of the light may be inverted.

The phase shift pattern 120 has a first thickness t1 corresponding to the first area A1 of the substrate 10, and has a second thickness t2 corresponding to the second area A2. A first opening H1 corresponding to the first area A1 and a second opening H2 corresponding to the second area A2 is defined in the phase shift pattern 120. Thus, a portion of the phase shift pattern 120 adjacent to the first opening H1 has the first thickness t1, and a portion of the phase shift pattern 120 adjacent to the second opening H2 has a second thickness t2. The first opening H1 has a first opening width W1. The second opening H2 has a second opening width W2.

The first and second thicknesses t1 and t2 may be determined by an experimental result or a simulation according to the second height h2 and a material included in the phase shift pattern 120. In an exemplary embodiment, when the phase shift pattern 120 includes chrome oxide nitride ($CrO_xN_y$), for example, a difference between the first thickness t1 and the second thickness t2 may be about 0.003 times the second height h2.

The phase shift mask 100 is placed on the substrate 10 on which the photoresist layer 20 is disposed. And then, the photoresist layer 20 is irradiated by light which passes through the first opening H1 and the second opening H2 of the phase shift mask 100.

The light through the first opening H1 is focused in the photoresist layer 20. Thus, a portion of the photoresist layer 20 having a first width Wa which is less than the first opening width W1 is irradiated.

The light through the second opening H2 is focused in the photoresist layer 20. Thus, a portion of the photoresist layer 20 having a second width Wb which is less than the second opening width W2 is irradiated.

Thus, as the first thickness t1 at a portion of the phase shift pattern 120 where the first opening H1 is defined and the second thickness t2 at a portion of the phase shift pattern 120 where the second opening H2 is defined are different from each other, although heights of the first and second areas A1 and A2 of the substrate 10 which is irradiated by light through the first and second openings H1 and H2 are different each other, the focus of the light may be provided in the photoresist layer 20.

Referring to FIG. 1B, a portion of the photoresist layer 20 which is irradiated is removed by a developer. A photoresist pattern 20a is provided by removing the portion of the photoresist layer 20. And then, the substrate 10 is partially etched using the photoresist pattern 20a.

The photoresist pattern 20a is provided by developing the photoresist layer 20 which is irradiated. In an exemplary embodiment, when the photoresist pattern 20a includes positive photoresist composition, the portion of the photoresist layer 20 which is irradiated is removed, so that an opening pattern having a first width Wa at the first area A1 and an opening pattern having a second width Wb at the second area A2 are defined in the photoresist pattern 20a.

The opening pattern having the first width Wa is defined corresponding to the first opening width W1 of the first opening H1. Light through the first opening H1 of the phase shift pattern 120 is focused in the photoresist layer 20, so that the first width Wa is less than the first opening width W1. Thus, a more detailed pattern than maximum precision of the phase shift mask 100 may be provided.

The opening pattern having the second width Wb is defined corresponding to the second opening width W2 of the second opening H2. Light through the second opening H2 of the phase shift pattern 120 is focused in the photoresist layer 20, so that the second width Wb is less than the second opening width W2. Thus, a more detailed pattern than maximum precision of the phase shift mask 100 may be provided.

As the photoresist pattern 20a is provided, a portion of the substrate 10 is exposed. Thus, the first area A1 of the substrate 10 is exposed by the first width Wa, and the second area A2 of the substrate 10 is exposed by the second width Wb.

Referring to FIG. 1C, the substrate 10 is partially etched using the photoresist pattern 20a, so that a first pattern P1 and a second pattern P2 are provided on the substrate 10. And then, remained photoresist pattern 20a is removed.

The first pattern P1 is provided in the first area A1 of the substrate 10, and has the first width Wa. The second pattern P2 is provided in the second area A2 and has the second width Wb.

When the photoresist pattern 20a includes positive photoresist composition, the first pattern P1 may be a recess corresponding to the first opening H1 of the phase shift mask 100. In an exemplary embodiment, the first pattern P1 may be a contact hole, for example.

When the photoresist pattern 20a includes positive photoresist composition, the second pattern P2 may be a recess corresponding to the second opening H2 of the phase shift mask 100. In an exemplary embodiment, the second pattern P2 may be a contact hole, for example.

In the exemplary embodiment, although the substrate 10 includes the first and second areas A1 and A2 different from each other, the phase shift mask 100 includes the phase shift pattern 120 having the first and second thicknesses t1 and t2 different from each other, so that precise pattern may be provided in the first and second areas A1 and A2. Thus, while manufacturing the phase shift mask 100, a width of an opening is not required to be adjusted considering a height difference of the substrate 10. The height difference of the substrate 10 may be considered by controlling the thickness of the phase shift pattern 120 instead, so that a precise pattern may be provided.

In addition, the photoresist layer 20 is irradiated at a focus of light passing though the phase shift mask 100, so that precise pattern smaller than a width of opening of the phase shift mask 100 may be provided.

Figure 2A:
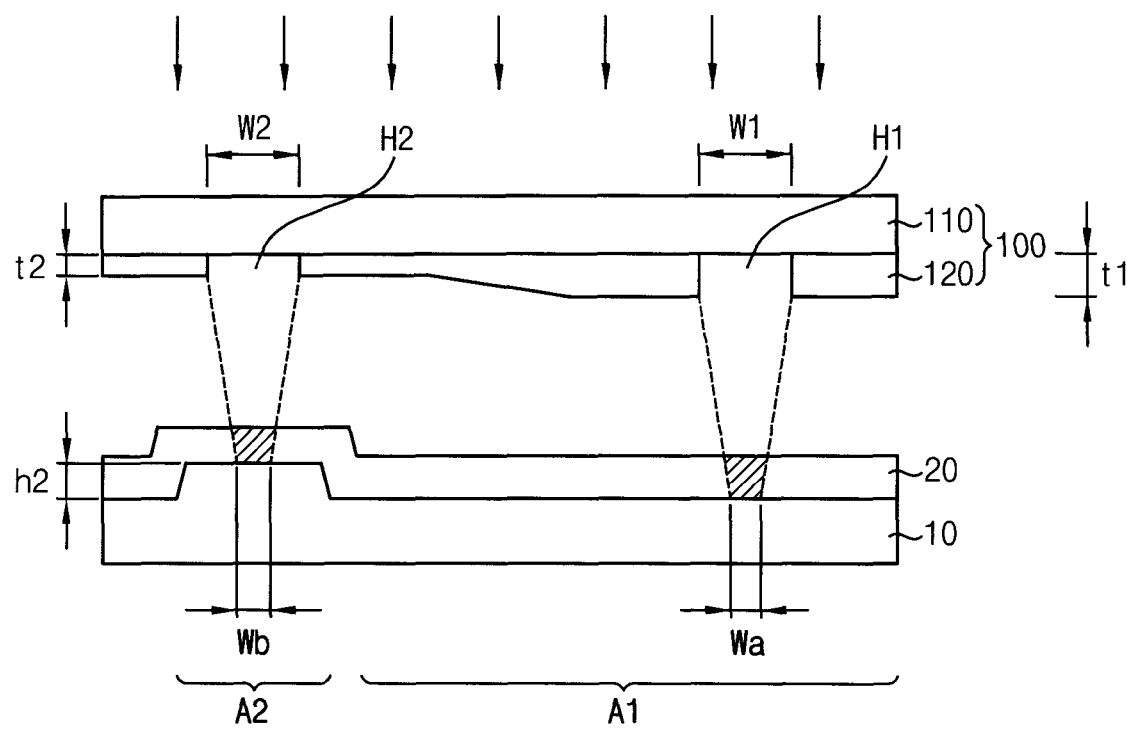
FIGS. 2A to 2C are cross-sectional views illustrating an exemplary embodiment of a patterning method according to the invention.
Figure 2B:
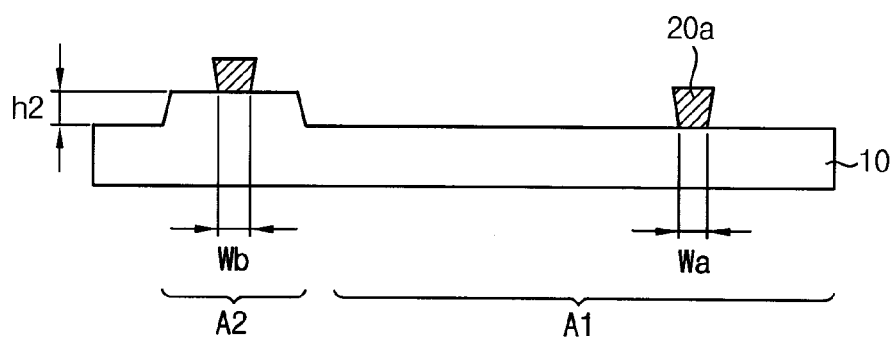
Figure 2C:
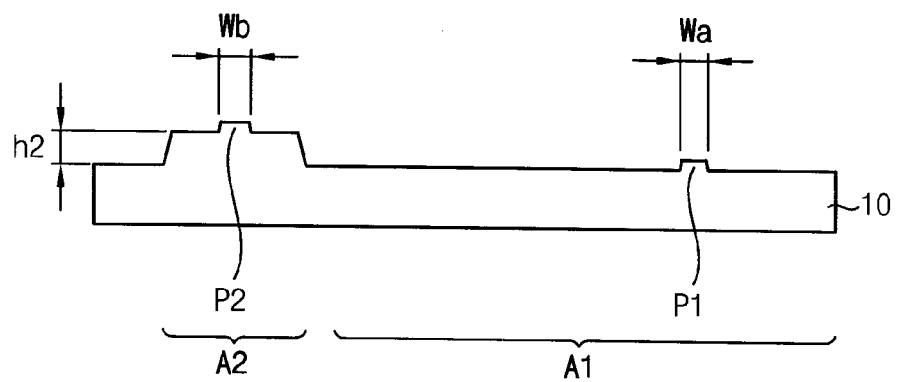

FIGS. 2A to 2C are cross-sectional views illustrating a patterning method according to an exemplary embodiment of the invention. The patterning method is substantially the same as a patterning method of FIGS. 1A to 1C, except for using negative photoresist composition. Thus, any further detailed descriptions concerning the same elements will be briefly described or be omitted.

Referring to FIG. 2A, a phase shift mask 100 is placed on a substrate 10 to face the substrate 10, and then a photoresist layer 20 on the substrate 10 is irradiated by light which passes the phase shift mask 100.

The photoresist layer 20 is disposed on the substrate 10.

The photoresist layer 20 includes a photoresist composition. The photoresist composition may include a negative photoresist composition in which a portion of the positive photoresist composition that is not exposed to light becomes soluble to a developer. In an exemplary embodiment, the photoresist composition may include ethylencally unsaturated compound, photoinitiator, thermosetting composition or organic solvent, for example.

The substrate 10 has a first area A1 and a second area A2 which is higher than the first area A1 by a second height h2.

The phase shift mask 100 includes a transparent substrate 110 and a phase shift pattern 120 provided on the transparent substrate 110.

The phase shift pattern 120 changes phase of light which passes the phase shift pattern 120.

The phase shift pattern 120 has a first thickness t1 corresponding to the first area A1 of the substrate 10, and has a second thickness t2 corresponding to the second area A2. A first opening H1 corresponding to the first area A1 of the substrate 10 and a second opening H2 corresponding to the second area A2 are defined in the phase shift pattern 120. The first opening H1 has a first opening width W1. The second opening H2 has a second opening width W2.

The first and second thicknesses t1 and t2 may be determined by an experimental result or a simulation according to the second height h2 and a material included in the phase shift pattern 120.

The phase shift mask 100 is placed on the substrate 10 on which the photoresist layer 20 is disposed. And then, the photoresist layer 20 is irradiated by light which passes through the first opening H1 and the second opening H2 of the phase shift mask 100.

The light through the first opening H1 is focused in the photoresist layer 20. Thus, a portion of the photoresist layer 20 having a first width Wa which is less than the first opening width W1 is irradiated.

The light through the second opening H2 is focused in the photoresist layer 20. Thus, a portion of the photoresist layer 20 having a second width Wb which is less than the second opening width W2 is irradiated.

Referring to FIG. 2B, a portion of the photoresist layer 20 which is not irradiated is removed by a developer. A photoresist pattern 20a is provided by removing the portion of the photoresist layer 20. And then, the substrate 10 is partially etched using the photoresist pattern 20a.

The photoresist pattern 20a is provided by developing the photoresist layer 20 which is irradiated. In an exemplary embodiment, when the photoresist pattern 20a includes negative photoresist composition, the portion of the photoresist layer 20 which is not irradiated is removed, so that the photoresist pattern 20a has a pattern having a first width Wa at the first area A1, and a pattern having a second width Wb at the second area A2.

The pattern having the first width Wa is provided corresponding to the first opening width W1 of the first opening H1. Light through the first opening H1 of the phase shift pattern 120 is focused in the photoresist layer 20, so that the first width Wa is less than the first opening width W1.

The pattern having the second width Wb is provided corresponding to the second opening width W2 of the second opening H2. Light through the second opening H2 of the phase shift pattern 120 is focused in the photoresist layer 20, so that the second width Wb is less than the second opening width W2.

As the photoresist pattern 20a is provided, a portion of the substrate 10 is exposed. Thus, the first area A1 of the substrate 10 is exposed except for the first width Wa, the second area A2 of the substrate 10 is exposed except for the second width Wb.

Referring to FIG. 2C, the substrate 10 is partially etched using the photoresist pattern 20a, so that a first pattern P1 and a second pattern P2 are provided on the substrate 10. And then, remained photoresist pattern 20a is removed.

The first pattern P1 is provided in the first area A1 of the substrate 10, and has the first width Wa. The second pattern P2 is provided in the second area A2 and has the second width Wb.

When the photoresist pattern 20a includes negative photoresist composition, the first pattern P1 may be a pattern protruded form the substrate 10 corresponding to the first opening H1 of the phase shift mask 100. In an exemplary embodiment, the first pattern P1 may be metal pattern, for example.

When the photoresist pattern 20a includes negative photoresist composition, the second pattern P2 may be a pattern protruded form the substrate 10 corresponding to the second opening H2 of the phase shift mask 100. In an exemplary embodiment, the second pattern P2 may be metal pattern, for example.

Figure 3A:
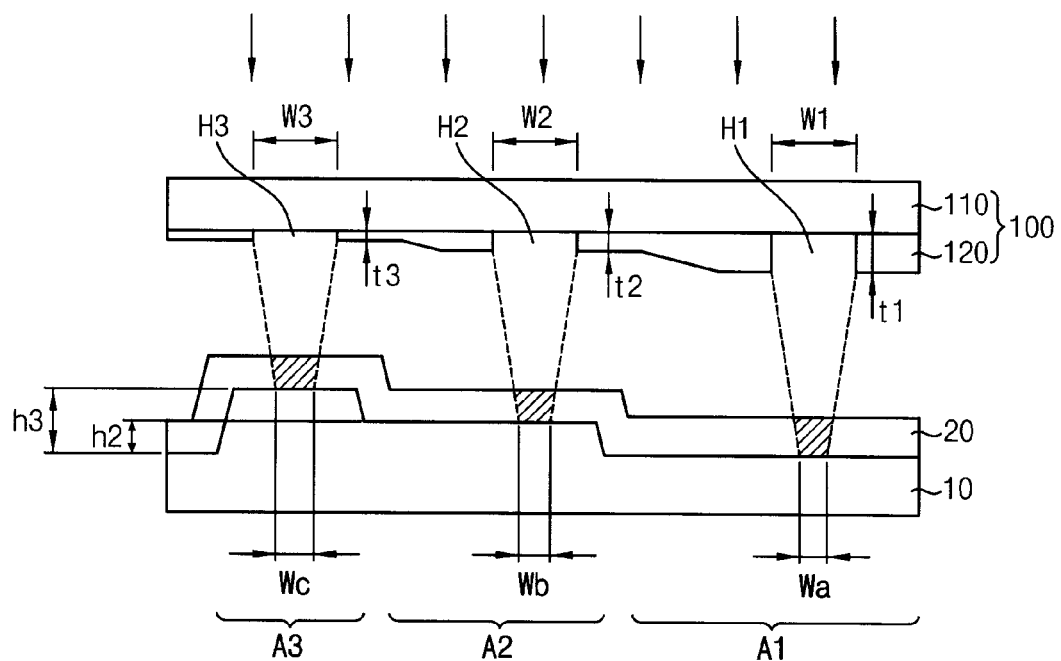
FIGS. 3A to 3C are cross-sectional views illustrating an exemplary embodiment of a patterning method according to the invention.
Figure 3B:
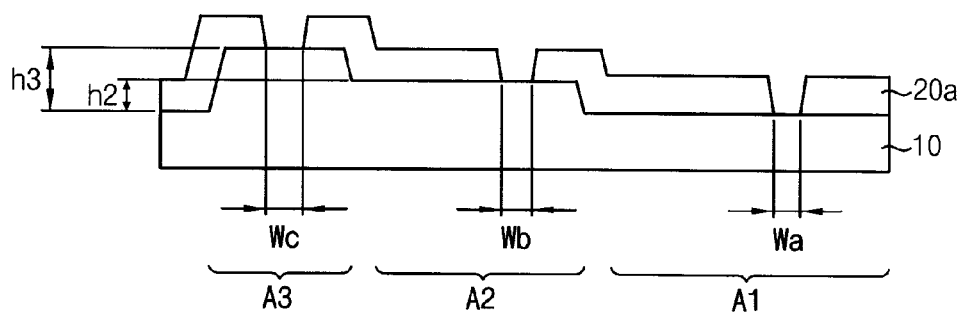
Figure 3C:
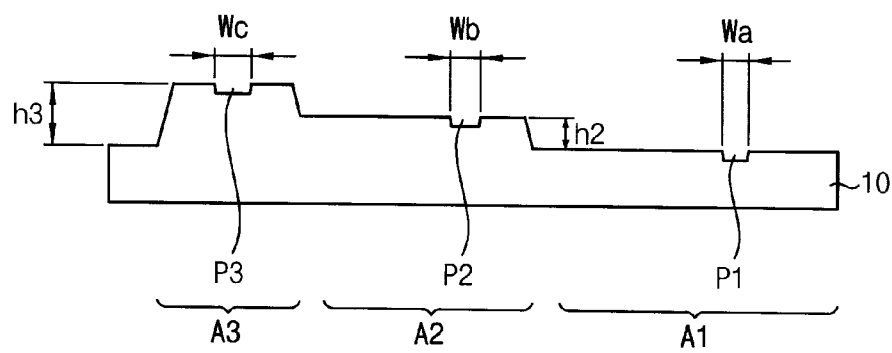

FIGS. 3A to 3C are cross-sectional views illustrating a patterning method according to an exemplary embodiment of the invention. The patterning method is substantially the same as a patterning method of FIGS. 1A to 1C, except that a substrate 10 further includes a third area A3. Thus, any further detailed descriptions concerning the same elements will be briefly described or be omitted.

Referring to FIG. 3A, a phase shift mask 100 is placed on a substrate 10 to face the substrate 10, and then a photoresist layer 20 on the substrate 10 is irradiated by light which passes the phase shift mask 100.

The photoresist layer 20 is disposed on the substrate 10.

The photoresist layer 20 includes a photoresist composition. The photoresist composition may include a positive photoresist composition in which a portion of the positive photoresist composition that is exposed to light becomes soluble to a developer.

The substrate 10 has a first area A1, a second area A2 which is higher than the first area A1 by a second height h2, and a third area A3 which is higher than the first area A1 by a third height h3. The third height h3 is greater than the second height h2. Thus, the substrate 10 has various heights different from each other due to a metal pattern provided on the substrate 10. Accordingly, a height of the photoresist layer 20 in the second area A2 is greater than a height of the photoresist layer 20 in the first area A1, and a height of the photoresist layer 20 in the third area A3 is greater than the height of the photoresist layer 20 in the second area A2.

The phase shift mask 100 includes a transparent substrate 110 and a phase shift pattern 120 provided on the transparent substrate 110.

The transparent substrate 110 passes light, and does not change phase of the light. In an exemplary embodiment, the transparent substrate 110 may include quartz, for example.

The phase shift pattern 120 changes phase of light which passes the phase shift pattern 120.

The phase shift pattern 120 has a first thickness t1 corresponding to the first area A1 of the substrate 10, has a second thickness t2 corresponding to the second area A2, and has third thickness t3 corresponding to the third area A3. A first opening H1 corresponding to the first area A1 of the substrate 10, a second opening H2 corresponding to the second area A2, and a third opening H3 corresponding to the third area A3 are defined in the phase shift pattern 120. Thus, a portion of the phase shift pattern 120 adjacent to the first opening H1 has the first thickness t1, a portion of the phase shift pattern 120 adjacent to the second opening H2 has a second thickness t2, and a portion of the phase shift pattern 120 adjacent to the third opening H3 has a third thickness t3. The first opening H1 has a first opening width W1. The second opening H2 has a second opening width W2. The third opening H3 has a third opening width W3.

The first, second and third thicknesses t1, t2 and t3 may be determined by an experimental result or a simulation according to the second height h2, the third height h3 and a material included in the phase shift pattern 120. In an exemplary embodiment, when the phase shift pattern 120 includes chrome oxide nitride (CrOxNy), for example, a difference between the first thickness t1 and the second thickness t2 may be about 0.003 times the second height h2. In addition, a difference between the second thickness t2 and the third thickness t3 may be about 0.003 times a difference between the third height h3 and the second height h2.

The light through the first opening H1 is focused in the photoresist layer 20. Thus, a portion of the photoresist layer 20 having a first width Wa which is less than the first opening width W1 is irradiated.

The light through the second opening H2 is focused in the photoresist layer 20. Thus, a portion of the photoresist layer 20 having a second width Wb which is less than the second opening width W2 is irradiated.

The light through the third opening H3 is focused in the photoresist layer 20. Thus, a portion of the photoresist layer 20 having a third width Wc which is less than the third opening width W3 is irradiated.

Referring to FIG. 3B, a portion of the photoresist layer 20 which is irradiated is removed by a developer. A photoresist pattern 20a is provided by removing the portion of the photoresist layer 20. And then, the substrate 10 is partially etched using the photoresist pattern 20a.

The photoresist pattern 20a is provided by developing the photoresist layer 20 which is irradiated. In an exemplary embodiment, when the photoresist pattern 20a includes positive photoresist composition, the portion of the photoresist layer 20 which is irradiated is removed, so that an opening pattern having a first width Wa at the first area A1, an opening pattern having a second width Wb at the second area A2 and an opening pattern having a third width Wc at the third area A3 are defined in the photoresist pattern 20a.

The opening pattern having the first width Wa is defined corresponding to the first opening width W1 of the first opening H1. The opening pattern having the second width Wb is defined corresponding to the second opening width W2 of the second opening H2. The opening pattern having the third width Wc is defined corresponding to the third opening width W3 of the third opening H3.

As the photoresist pattern 20a is provided, a portion of the substrate 10 is exposed. Thus, the first area A1 of the substrate 10 is exposed by the first width Wa, the second area A2 of the substrate 10 is exposed by the second width Wb, the third area A3 of the substrate 10 is exposed by the third width Wc.

Referring to FIG. 3C, the substrate 10 is partially etched using the photoresist pattern 20a, so that a first pattern P1, a second pattern P2 and a third pattern P3 are provided on the substrate 10. And then, remained photoresist pattern 20a is removed.

The first pattern P1 is provided in the first area A1 of the substrate 10, and has the first width Wa. The second pattern P2 is provided in the second area A2 and has the second width Wb. The third pattern P3 is provided in the third area A3 and has the third width Wc.

When the photoresist pattern 20a includes positive photoresist composition, the first pattern P1 may be a recess corresponding to the first opening H1 of the phase shift mask 100. In an exemplary embodiment, the first pattern P1 may be a contact hole, for example.

When the photoresist pattern 20a includes positive photoresist composition, the second pattern P2 may be a recess corresponding to the second opening H2 of the phase shift mask 100. In an exemplary embodiment, the second pattern P2 may be a contact hole, for example.

When the photoresist pattern 20a includes positive photoresist composition, the third pattern P3 may be a recess corresponding to the third opening H3 of the phase shift mask 100. In an exemplary embodiment, the third pattern P3 may be a contact hole, for example.

Figure 4A:
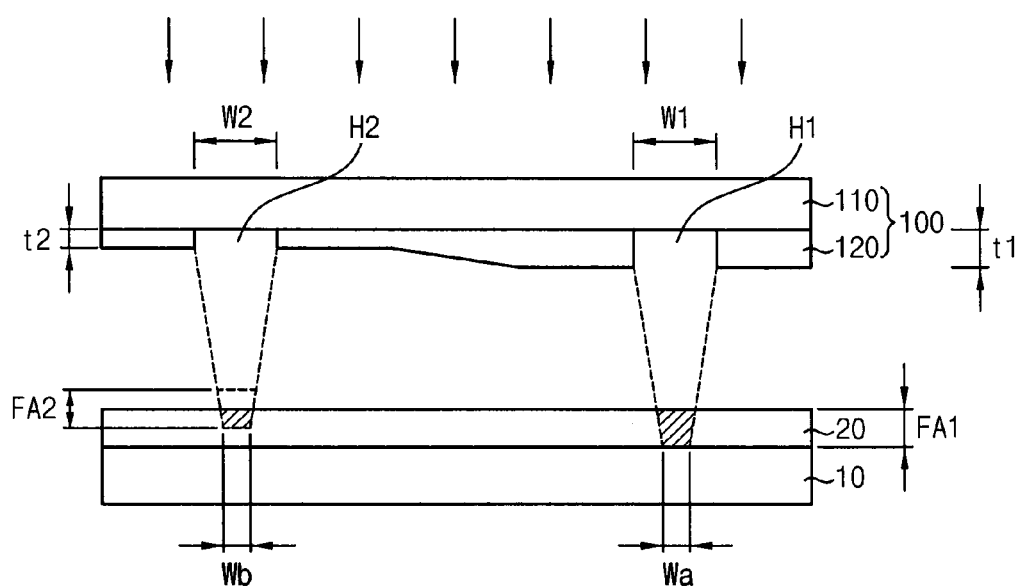
FIGS. 4A to 4C are cross-sectional views illustrating an exemplary embodiment of a patterning method according to the invention.
Figure 4B:
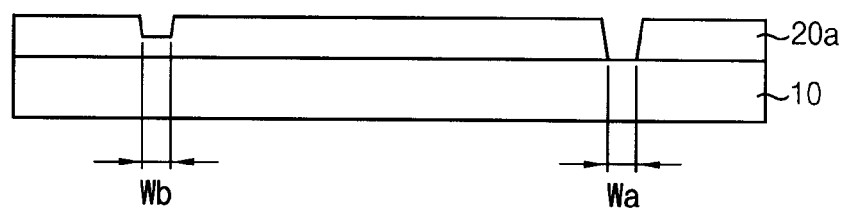
Figure 4C:
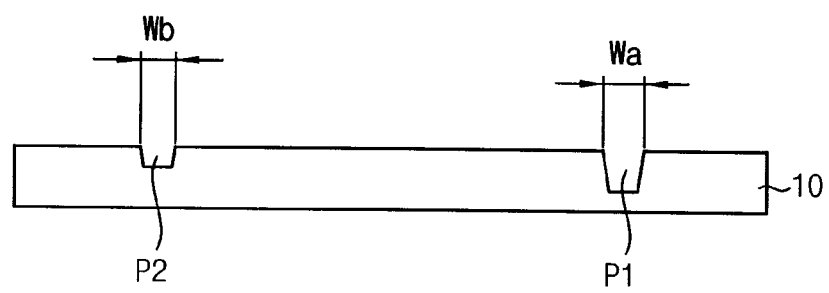

FIGS. 4A to 4C are cross-sectional views illustrating a patterning method according to an exemplary embodiment of the invention.

Referring to FIG. 4A, a phase shift mask 100 is placed on a substrate 10 to face the substrate 10, and then a photoresist layer 20 on the substrate 10 is irradiated by light which passes the phase shift mask 100.

The photoresist layer 20 is disposed on the substrate 10. The substrate 10 may includes a base substrate and a metal pattern provided on the base substrate. In an exemplary embodiment, the base substrate may be a transparent insulation substrate including glass and/or plastic, for example. In an exemplary embodiment, the metal pattern may include a TFT, for example.

The photoresist layer 20 includes a photoresist composition. The photoresist composition may include a positive photoresist composition in which a portion of the positive photoresist composition that is exposed to light becomes soluble to a developer. In an exemplary embodiment, the photoresist composition may include acid generator, a resin which increase its alkali solubility by an acid-catalyzed reaction, alkali metallic salt and organic solvent, for example.

The phase shift mask 100 includes a transparent substrate 110 and a phase shift pattern 120 provided on the transparent substrate 110.

The transparent substrate 110 passes light, and does not change phase of the light. In an exemplary embodiment, the transparent substrate 110 may include quartz, for example.

The phase shift pattern 120 changes phase of light which passes the phase shift pattern 120. In an exemplary embodiment, the phase shift pattern 120 may include phase shift material, such as chrome oxide nitride (CrOxNy), molybdenum silicide oxide nitride (MoSiOxNy), a combination of chrome oxide nitride (CrOxNy) and molybdenum silicide oxide nitride (MoSiOxNy) and etc.

The phase shift pattern 120 has a first thickness t1 and a second thickness t2. A first opening H1 is defined where the phase shift pattern 120 has the first thickness t1. A second opening H2 is defined where the phase shift pattern 120 has the second thickness t2. The first opening H1 has a first opening width W1. The second opening H2 has a second opening width W2. The first thickness t1 is greater than the second thickness t2.

The light through the first opening H1 is focused in the photoresist layer 20. A first focus area FA1 near the focus, where the photoresist layer 20 is reacted is hatched in FIG. 4A. Thus, a portion of the photoresist layer 20 in the first focus area FA1 is reacted with the light.

A second focus area FA2 of light through the second opening H2 is shown in FIG. 4A. A portion of the photoresist layer 20 in the second focus area FA2 is reacted with the light (hatched area). Comparing to the first focus area, the second focus area FA2 includes an upper portion of the portion of the photoresist layer 20 which is spaced apart from a surface of the substrate 10, so that the upper portion of the photoresist layer 20 is reacted with the light. Thus, the portion of the phase shift mask 100 where the second opening H2 is defined may be used as a half-ton mask.

The first and second thicknesses t1 and t2 may be determined by an experimental result or a simulation according to a shape of a photoresist pattern 20a (refers to FIG. 4B) and a material included in the phase shift pattern 120. In an exemplary embodiment, when the phase shift pattern 120 includes chrome oxide nitride (CrOxNy), for example, a difference between the first thickness t1 and the second thickness t2 may be about 0.003 times a difference between a first focus distance and a second focus distance. The first focus distance is from the first opening H1 of the phase shift mask 100 to a focus of light which passes the first opening H1. The second focus distance is from the second opening H2 of the phase shift mask 100 to a focus of light which passes the second opening H2.

Thus, by adjusting thickness of the phase shift pattern 120 of the phase shift mask 100, a focus distance for photoreaction of the photoresist layer 20 may be controlled. Thus, the phase shift mask 100 may be used as a two-tone mask having a half-tone mask area.

The phase shift mask 100 is placed on the substrate 10 on which the photoresist layer 20 is provided. And then, the photoresist layer 20 is irradiated by light which passes through the first opening H1 and the second opening H2 of the phase shift mask 100.

A portion of the phase shift mask 100 having the second thickness t2 may be used as a half-tone mask. Thus, the phase shift mask 100 may be used as a two-tone mask.

Referring to FIG. 4B, a portion of the photoresist layer 20 which is irradiated is removed by a developer. A photoresist pattern 20a is provided by removing the portion of the photoresist layer 20. And then, the substrate 10 is partially etched using the photoresist pattern 20a.

The photoresist pattern 20a is provided by developing the photoresist layer 20 which is irradiated. In an exemplary embodiment, when the photoresist pattern 20a includes positive photoresist composition, the portion of the photoresist layer 20 which is irradiated is removed, so that the photoresist pattern 20a has an opening pattern having a first width Wa at the first area A1, and a concave pattern having a second width Wb at the second area A2, for example. The opening pattern having the first width Wa is defined corresponding to the first opening width W1 of the first opening H1. The concave pattern having the second width Wb is provided corresponding to the second opening width W2 of the second opening H2.

As the photoresist pattern 20a is provided, a portion of the substrate 10 is exposed. Thus, the first area A1 of the substrate 10 is exposed by the first width Wa. In addition, thickness of a portion of the photoresist pattern 20a corresponding to the second width Wb is less than adjacent portion of the photoresist pattern 20a.

Referring to FIG. 4C, the substrate 10 is partially etched using the photoresist pattern 20a, so that a first pattern P1 and a second pattern P2 are provided on the substrate 10. And then, remained photoresist pattern 20a is removed.

The first pattern P1 has the first width Wa. The second pattern P2 has the second width Wb.

When the photoresist pattern 20a includes positive photoresist composition, the first pattern P1 may be a recess corresponding to the first opening H1 of the phase shift mask 100. In an exemplary embodiment, the first pattern P1 may be a contact hole, for example.

When the photoresist pattern 20a includes positive photoresist composition, the second pattern P2 may be a recess corresponding to the second opening H2 of the phase shift mask 100. In an exemplary embodiment, the second pattern P2 may be a contact hole, for example.

As the phase shift mask 100 may function as a two-tone mask, depth of the first pattern P1 is greater than depth of the second pattern P2.

Figure 5A:
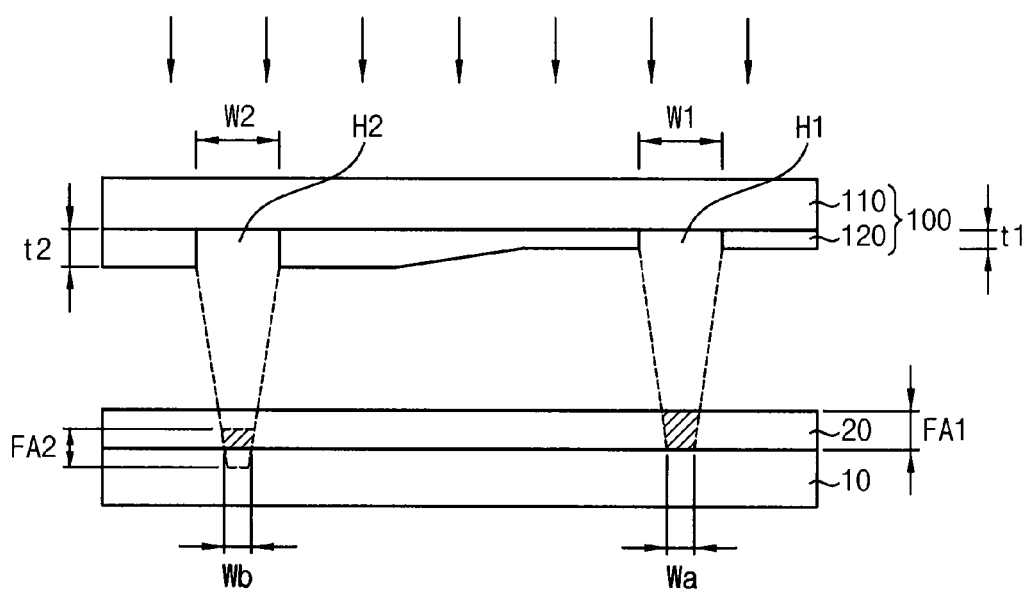
FIGS. 5A to 5C are cross-sectional views illustrating an exemplary embodiment of a patterning method according to the invention.
Figure 5B:
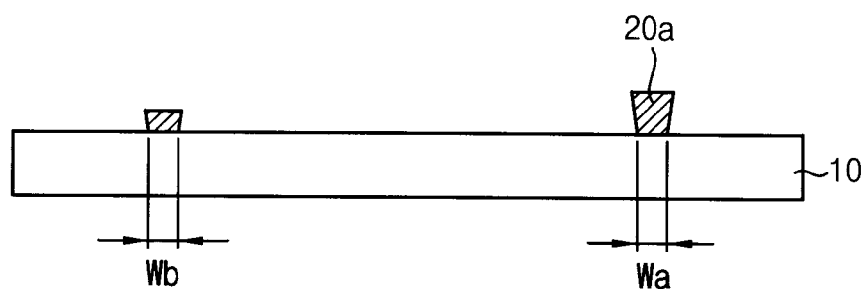
Figure 5C:
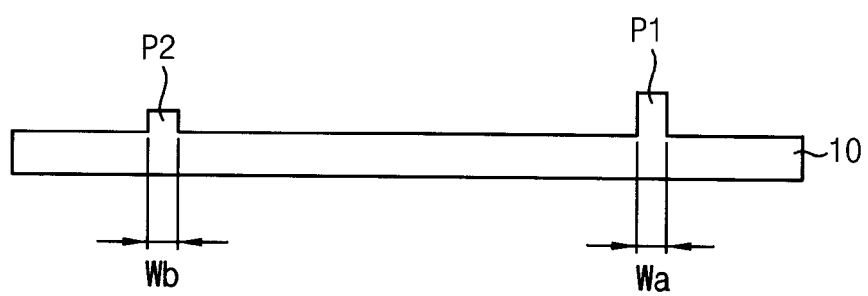

FIGS. 5A to 5C are cross-sectional views illustrating a patterning method according to an exemplary embodiment of the invention. The patterning method is substantially the same as a patterning method of FIGS. 4A to 4C, except for using negative photoresist composition. Thus, any further detailed descriptions concerning the same elements will be briefly described or be omitted.

Referring to FIG. 5A, a phase shift mask 100 is placed on a substrate 10 to face the substrate 10, and then a photoresist layer 20 on the substrate 10 is irradiated by light which passes the phase shift mask 100.

The photoresist layer 20 is disposed on the substrate 10.

The photoresist layer 20 includes a photoresist composition. The photoresist composition may include a negative photoresist composition in which a portion of the positive photoresist composition that is not exposed to light becomes soluble to a developer. In an exemplary embodiment, the photoresist composition may include ethylencally unsaturated compound, photoinitiator, thermosetting composition or organic solvent.

The phase shift mask 100 includes a transparent substrate 110 and a phase shift pattern 120 disposed on the transparent substrate 110. The phase shift pattern 120 changes phase of light which passes the phase shift pattern 120.

The phase shift pattern 120 has a first thickness t1 and a second thickness t2. A first opening H1 is defined where the phase shift pattern 120 has the first thickness t1. A second opening H2 is defined where the phase shift pattern 120 has the second thickness t2. The first opening H1 has a first opening width W1. The second opening H2 has a second opening width W2. The first thickness t1 is less than the second thickness t2.

The light through the first opening H1 is focused in the photoresist layer 20. A first focus area FA1 near the focus, where the photoresist layer 20 is reacted is hatched in FIG. 5A. Thus, a portion of the photoresist layer 20 in the first focus area FA1 is reacted with the light.

A second focus area FA2 of light through the second opening H2 is shown in FIG. 5A. A portion of the photoresist layer 20 in the second focus area FA2 is reacted with the light (hatched area). Comparing to the first focus area FA1, the second focus area FA2 includes a portion of the portion of the photoresist layer 20 which is spaced apart from a surface of the substrate 10, so that an upper portion of the photoresist layer 20 is reacted with the light. Thus, the portion of the phase shift mask 100 where the second opening H2 is defined may be used as a half-ton mask.

The first and second thicknesses t1 and t2 may be determined by an experimental result or a simulation according to a shape of a photoresist pattern 20a (refers to FIG. 5B) and a material included in the phase shift pattern 120.

The phase shift mask 100 is placed on the substrate 10 on which the photoresist layer 20 is provided. And then, the photoresist layer 20 is irradiated by light which passes through the first opening H1 and the second opening H2 of the phase shift mask 100.

Referring to FIG. 5B, a portion of the photoresist layer 20 which is irradiated is removed by a developer. A photoresist pattern 20a is provided by removing the portion of the photoresist layer 20. And then, the substrate 10 is partially etched using the photoresist pattern 20a.

The photoresist pattern 20a is provided by developing the photoresist layer 20 which is irradiated. In an exemplary embodiment, when the photoresist pattern 20a includes negative photoresist composition, the portion of the photoresist layer 20 which is not irradiated is removed, so that the photoresist pattern 20a has a first photoresist pattern having a first width Wa at the first area A1, and a second photoresist pattern having a second width Wb at the second area A2, for example. The first photoresist pattern having the first width Wa is provided corresponding to the first opening width W1 of the first opening H1. The second photoresist pattern having the second width Wb is provided corresponding to the second opening width W2 of the second opening H2. The first photoresist pattern is higher than the second photoresist pattern.

As the photoresist pattern 20a is provided, a portion of the substrate 10 is exposed. Thus, a portion of the substrate 10 where the first and second photoresist patterns are not provided is exposed.

Referring to FIG. 5C, the substrate 10 is partially etched using the photoresist pattern 20a, so that a first pattern P1 and a second pattern P2 are provided on the substrate 10. And then, remained photoresist pattern 20a is removed.

The first pattern P1 has the first width Wa. The second pattern P2 has the second width Wb.

When the photoresist pattern 20a includes negative photoresist composition, the first pattern P1 may be a pattern protruded form the substrate 10 corresponding to the first opening H1 of the phase shift mask 100. In an exemplary embodiment, the first pattern P1 may be metal pattern, for example.

When the photoresist pattern 20a includes negative photoresist composition, the second pattern P2 may be a pattern protruded form the substrate 10 corresponding to the second opening H2 of the phase shift mask 100. In an exemplary embodiment, the second pattern P2 may be metal pattern, for example.

As the phase shift mask 100 may function as a two-tone mask, a height of the first pattern P1 is greater than a height of the second pattern P2.

Figure 6A:
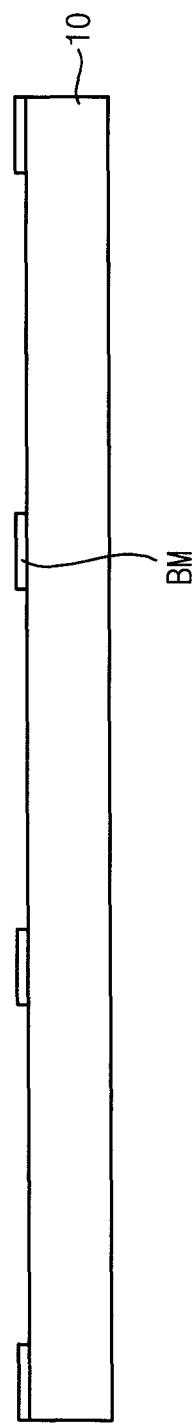
FIGS. 6A to 6G are cross-sectional views illustrating an exemplary embodiment of a patterning method according to the invention.
Figure 6B:
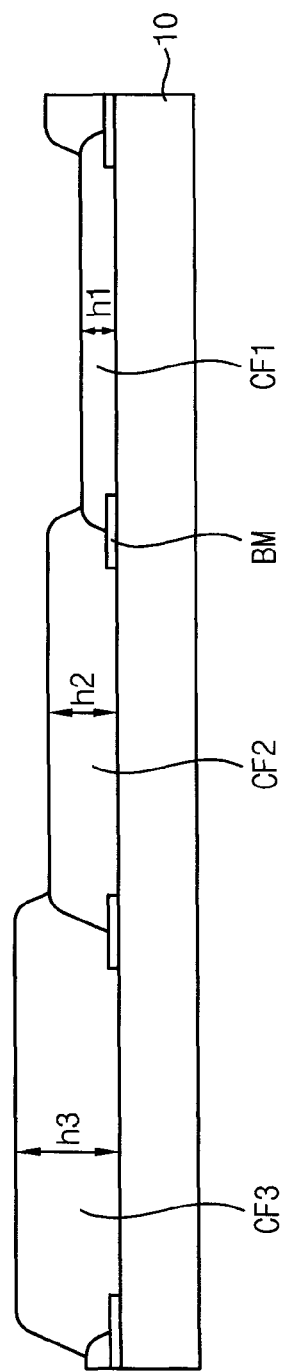
Figure 6C:
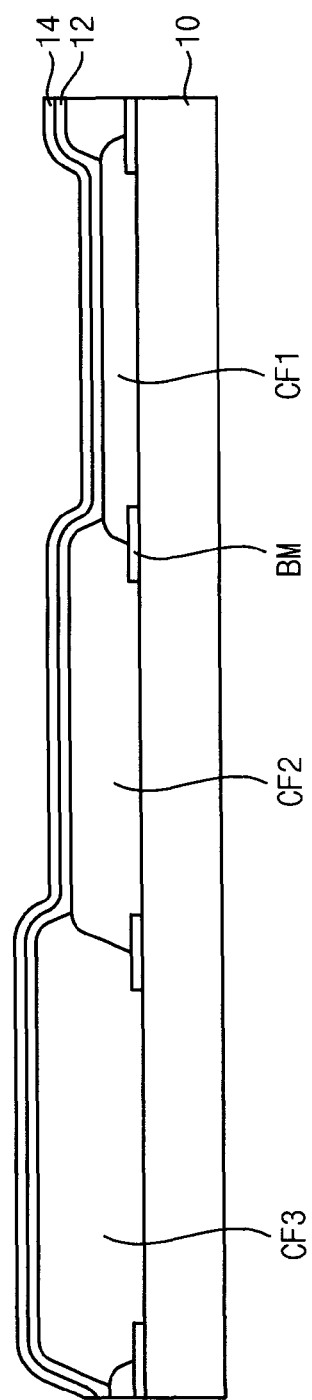

FIGS. 6A to 6C are cross-sectional views illustrating a patterning method according to an exemplary embodiment of the invention.

Referring to FIG. 6A, a black matrix BM is disposed on a TFT substrate 10.

In an exemplary embodiment, the TFT substrate 10 may include a base substrate and a circuit pattern provided on the base substrate and including a TFT. In an exemplary embodiment, the base substrate may be a transparent insulation substrate including glass and/or plastic, for example. The circuit pattern drives a pixel of a display panel.

The black matrix BM is disposed on the TFT substrate 10, and surrounds the pixel area displaying an image. Thus, the black matrix BM is disposed expect for the pixel area to block light. The black matrix BM may be disposed where the light should be blocked.

Referring to FIG. 6B, a first color filter CF1, a second color filter CF2 and a third color filter CF3 are disposed on the TFT substrate on which the black matrix BM is disposed.

The first color filter CF1 is disposed on the TFT substrate 10 on which the black matrix BM is disposed. The first color filter CF1 supplies colors to the light passing through the liquid crystal layer of the display panel. The first color filter CF1 has a first height h1. In an exemplary embodiment, the first color filter CF1 may be a blue color filter, for example.

The second color filter CF2 is disposed on the TFT substrate 10 on which the first color filter CF1 is disposed. The second color filter CF2 supplies colors to the light passing through the liquid crystal layer of the display panel. The second color filter CF2 has a second height h2. In an exemplary embodiment, the second color filter CF2 may be a green color filter, for example.

The third color filter CF3 is disposed on the TFT substrate 10 on which the first color filter CF1 and the second color filter CF2 are disposed. The third color filter CF3 supplies colors to the light passing through the liquid crystal layer of the display panel. The third color filter CF3 has a third height h3. In an exemplary embodiment, the third color filter CF3 may be a red color filter, for example.

The first height h1 may be less than the second height h2. The third height h3 may be greater than the second height h2. Thus, an upper surface of the first to third color filters CF1, CF2 and CF3 may have different heights from each other.

Although the first to third color filters CF1, CF2 and CF3 are overlapped with adjacent color filter CF in a boundary of the pixel area in the exemplary embodiment, the invention is not limited thereto, and the color filters may be spaced apart from adjacent color filters in the boundary of the pixel area.

Referring to FIG. 6C, an insulation layer 12 is disposed on the first to third color filters CF1, CF2 and CF3. And then, a conductive layer 14 is disposed on the insulation layer 12.

The insulation layer 12 protects the first to third color filters CF1, CF2 and CF3.

In an exemplary embodiment, the conductive layer 14 is disposed on the insulation layer 12, and may have a transparent conductive material, such as indium tin oxide ("ITO"), indium zinc oxide ("IZO") and etc. In an exemplary embodiment, the conductive layer 14 may include titanium (Ti) and/or molybdenum titanium (MoTi).

Figure 6D:
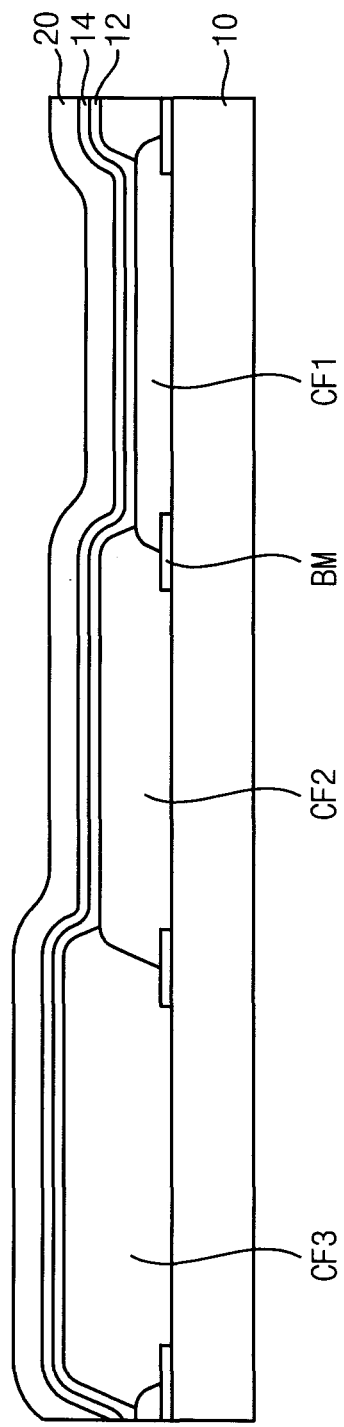

Referring to FIG. 6D, a photoresist layer 20 is disposed on the conductive layer 14.

The photoresist layer 20 includes a photoresist composition. The photoresist composition may include a negative photoresist composition in which a portion of the positive photoresist composition that is not exposed to light becomes soluble to a developer. In an exemplary embodiment, the photoresist composition may include ethylencally unsaturated compound, photoinitiator, thermosetting composition or organic solvent, for example.

Figure 6E:
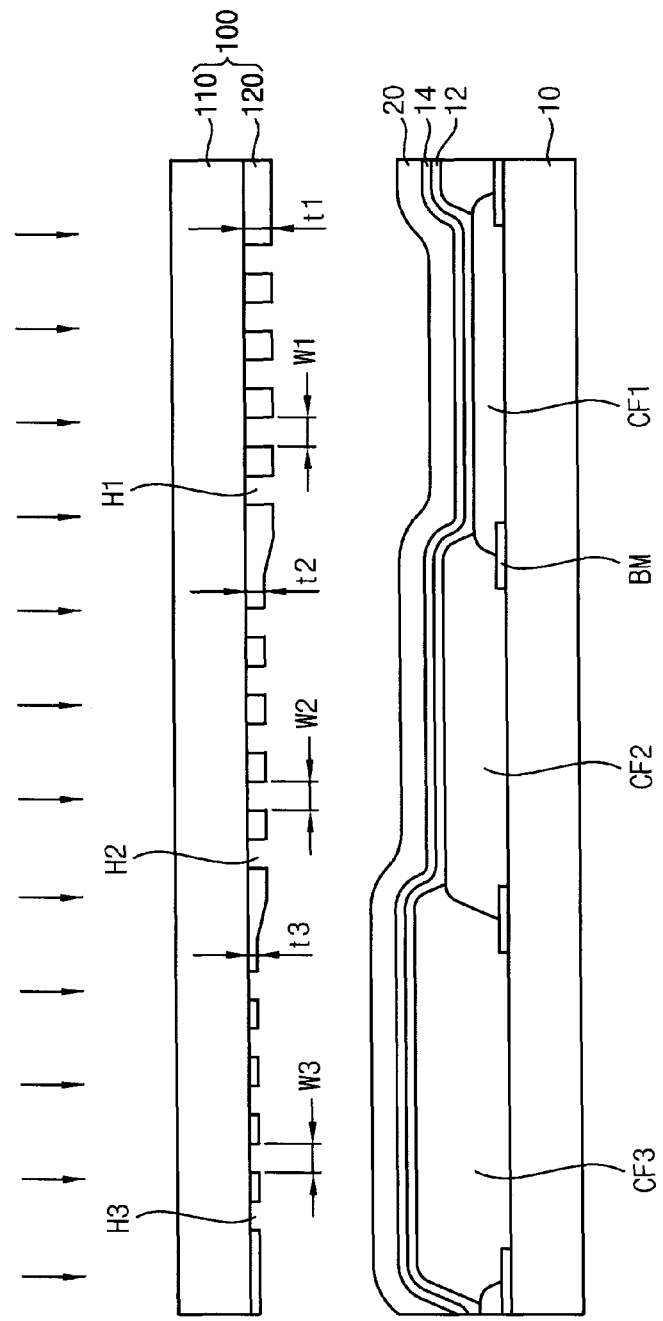

Referring to FIG. 6E, the photoresist layer 20 is irradiated by light using a phase shift mask 100.

The phase shift mask 100 includes a transparent substrate 110 and a phase shift pattern 120 disposed on the transparent substrate 110.

The transparent substrate 110 passes light, and does not change phase of the light. In an exemplary embodiment, the transparent substrate 110 may include quartz, for example.

The phase shift pattern 120 changes phase of light which passes the phase shift pattern 120. In an exemplary embodiment, the phase shift pattern 120 may include phase shift material, such as chrome oxide nitride (CrOxNy), molybdenum silicide oxide nitride (MoSiOxNy), a combination of chrome oxide nitride (CrOxNy) and molybdenum silicide oxide nitride (MoSiOxNy), and etc.

The phase shift pattern 120 has a first thickness t1 corresponding to the first color filter CF1, has a second thickness t2 corresponding to the second color filter CF2, and has third thickness t3 corresponding to the third color filter CF3. The third thickness t1 may be greater than the second thickness t2. The third thickness t3 may be less than the second thickness t2.

A plurality of first slit openings H1 is defined in a portion of the phase shift pattern 120 corresponding to the first color filter CF1 of the phase shift pattern 120. The first slit opening H1 has a first width W1.

A plurality of second slit openings H2 is defined in a portion of the phase shift pattern 120 corresponding to the second color filter CF2 of the phase shift pattern 120. The second slit opening H2 has a second width W2.

A plurality of third slit openings H3 is defined in a portion of the phase shift pattern 120 corresponding to the third color filter CF3 of the phase shift pattern 120. The third slit opening H3 has a third width W3.

The first width W1, the second width W2 and the third width W3 may be substantially the same with each other.

A phase shift mask 100 is placed on the photoresist layer 20 to face the photoresist layer 20, and then the photoresist layer 20 on the substrate 10 is irradiated by light which passes the first to third slit openings H1, H2 and H3.

Figure 6F:
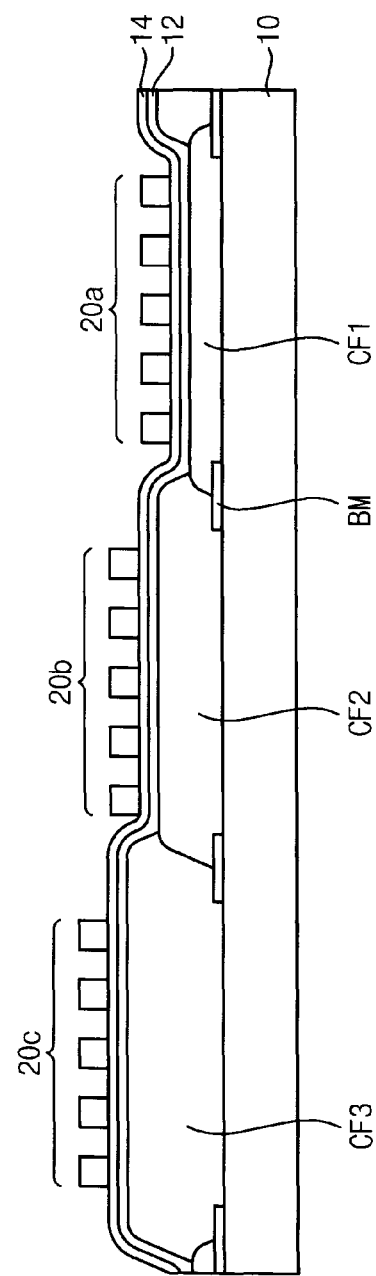

Referring to FIG. 6F, a portion of the photoresist layer 20 which is not irradiated is removed by a developer. A photoresist pattern 20a, a second photoresist pattern 20b and a third photoresist pattern 20c are provided by removing the portion of the photoresist layer 20. And then, the conductive layer 14 is partially etched using the photoresist pattern 20a.

The first to third photoresist patterns 20a, 20b and 20c are provided by developing the photoresist layer 20 which is irradiated by a developer. In an exemplary embodiment, when the first to third photoresist patterns 20a, 20b and 20c include negative photoresist composition, a portion of the photoresist layer 20 which is not irradiated is removed by a developer, thereby a first photoresist pattern 20a on the first color filter CF1, a second photoresist pattern 20b on the second color filter CF2 and the third photoresist pattern 20c on the third color filter CF3 are provided.

Figure 6G:
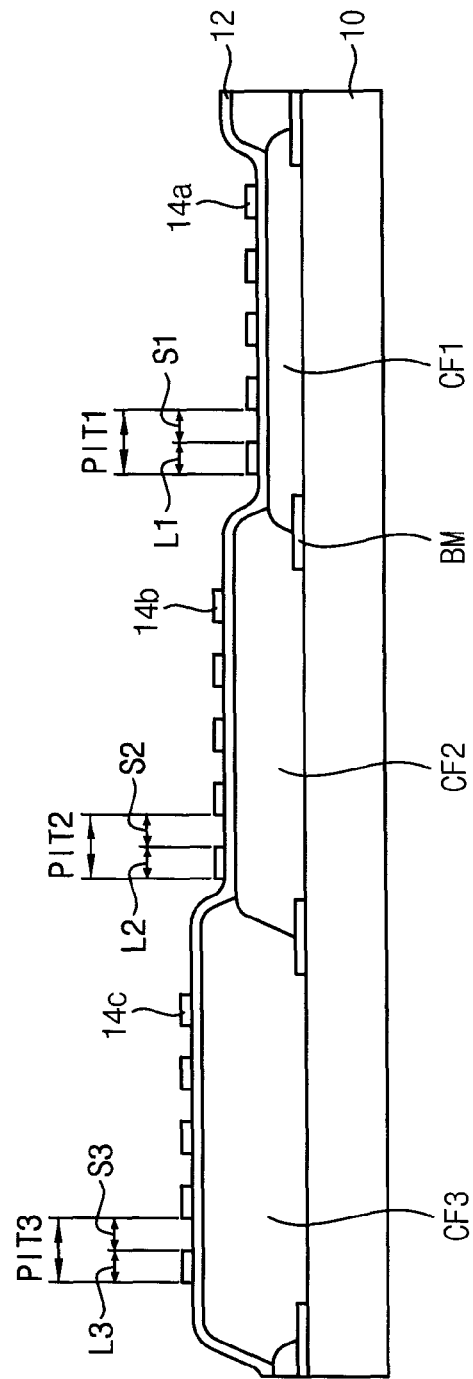

Referring to FIG. 6G a first pixel electrode 14a, a second pixel electrode 14b and a third pixel electrode 14c may be provided by partially etching the conductive layer 14 using the first to third photoresist patterns 20a, 20b and 20c. And then, remained portions of the first to third photoresist patterns 20a, 20b and 20c are removed.

A plurality of slits is defined in the first pixel electrode 14a. The first pixel electrode 14a and the slit define a first pitch PIT1 having a first line width L1 and a first separation distance S1. That is, the first pitch PIT1 is sum of the first line width L1 and the first separation distance S1. In an exemplary embodiment, the first line width L1 may be less than about 2 micrometers (μm), and the first separation distance S1 may be less than about 2 μm. Thus, the first pitch PIT1 may be less than about 4 μm.

A plurality of slits is defined in the second pixel electrode 14b. The second pixel electrode 14b and the slit define a second pitch PIT2 having a second line width L2 and a second separation distance S2. That is, the second pitch PIT2 is sum of the second line width L2 and the second separation distance S2. In an exemplary embodiment, the second line width L2 may be less than about 2 μm, and the second separation distance S2 may be less than about 2 μm. Thus, the second pitch PIT2 may be less than about 4 μm, A plurality of slits is defined in the third pixel electrode 14c includes a plurality of slits. The third pixel electrode 14c and the slit define a third pitch PIT3 having a third line width L3 and a third separation distance S3. That is, the third pitch PIT3 is sum of the third line width L3 and the third separation distance S3. In an exemplary embodiment, the third line width L3 may be less than about 2 μm, and the third separation distance S3 may be less than about 2 μm. Thus, the third pitch PIT3 may be less than about 4 μm, The first pitch PIT1, the second pitch PIT2 and the third pitch PIT3 may be substantially the same with each other.

The first to third color filters CF1, CF2 and CF3 may have heights different from each other. In a traditional mask which has an uniform thickness, opening widths corresponding to slits of the first to third pixel electrodes may be designed to be different from each other to form a uniform slit shape of the first to third pixel electors. However, in the exemplary embodiment, the phase shift pattern of the phase shift mask 100 has various thicknesses, so that uniform slit may be provided.

Thus, by adjusting thickness of the phase shift pattern of the phase shift mask considering a height difference of the substrate which is an object for pattering, so that precise pattern may be provided.

In addition, as a pattern of the mask becomes more precise, it is hard to adjust opening width of the mask. However, adjusting thickness of the phase shift pattern may be more efficient than adjusting opening width.

Although not shown in figures, the display panel may further include an opposite substrate facing the TFT substrate 10, and a liquid crystal layer between the opposite substrate and the TFT substrate 10.

In addition, although the display panel has a color filter on array ("COA") structure that the color filter is disposed on the TFT substrate 10 in the exemplary embodiment, the invention is not limited thereto, and the display panel may have various structures.

In addition, although the photoresist layer includes negative photoresist composition in the exemplary embodiment, the photoresist layer may include positive photoresist composition. Accordingly, proper mask pattern may be selected to manufacture the display panel.

According to the invention, although a substrate to form a pattern has various thicknesses, a phase shift mask has a phase shift layer having first and second thicknesses different from each other, so that a precise pattern may be provided. Thus, while manufacturing the phase shift mask, a width of opening is not required to be adjusted considering a height difference of the substrate. The height difference of the substrate may be considered by controlling the thickness of the phase shift pattern 120 instead, so that a precise pattern may be provided.

In addition, a photoresist layer is irradiated at a focus area of light passing the phase shift mask, so that precise pattern smaller than an opening width of the phase shift mask may be provided.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A phase shift mask comprising:
   a phase shift mask which comprises:
   a transparent substrate; and
   a phase shift pattern which is provided on the transparent substrate, and comprises:
   a first area having a first thickness;
   a second area having a second thickness which is less than the first thickness;
   a first opening having a first opening width and defined through the phase shift pattern at the first area; and
   a second opening having a second opening width which is different from the first opening width and defined through the phase shift pattern at the second area.

2. The phase shift mask of claim 1, wherein the phase shift pattern further comprises phase shift material which changes a phase of light which passes through the phase shift pattern.

3. The phase shift mask of claim 2, wherein
   the phase shift pattern further comprises chrome oxide nitride (CrOxNy), molybdenum silicide oxide nitride (MoSiOxNy), or a combination thereof, and
   the phase of light passing through the phase shift pattern is changed by about 180 degrees.

4. The phase shift mask of claim 1, wherein
   the phase shift mask is configured to pattern a substrate, which is an object for pattering disposed under the phase shift mask, the substrate comprising:
   a first area corresponding to the first opening of the phase shift mask, and
   a second area corresponding to the second opening of the phase shift mask,
   wherein the second area is higher than the first area, so that the second area of the substrate is closer to the phase shift mask than the first area.

5. The phase shift mask of claim 4, wherein
   the phase shift pattern further comprises chrome oxide nitride (CrOxNy), and
   a difference between the first thickness and the second thickness is about 0.003 times a height difference of the substrate between the second area and the first area.

6. The phase shift mask of claim 4, wherein a thickness of the phase shift pattern between the first area and the second area gradually changes along a direction from the first thickness to the second thickness.

7. The phase shift mask of claim 1, wherein the phase shift pattern further comprises a third area having a third thickness which is less than the second thickness.

8. The phase shift mask of claim 1, wherein the first and second openings are configured to focus light in a photoresist layer of a substrate which is an object for patterning disposed under the phase shift mask.

9. The phase shift mask of claim 1, wherein
the phase shift mask is configured to pattern a substrate, which is an object for patterning disposed under the phase shift mask, and
the first opening width of the first opening of the phase shift mask is larger than a width of a portion of the substrate upon which light which passes the first opening is irradiated.

10. The phase shift mask of claim 1, wherein
the phase shift mask is configured to pattern a substrate, which is an object for patterning disposed under the phase shift mask, and
the substrate comprises two different thicknesses corresponding to the first and second thicknesses of the phase shift pattern.

11. The phase shift mask of claim 1, wherein each of the first opening width and the second opening width of the phase shift pattern is less than about 2 micrometers.

12. A patterning method comprising:
disposing a photoresist layer on a substrate, the photoresist layer comprising a first area, and a second area which is higher than the first area by a second height;
irradiating light to the photoresist layer using a phase shift mask which comprises:
a transparent substrate, and
a phase shift pattern which is provided on the transparent substrate, and comprises a first area having a first thickness and a second area having a second thickness which is less than the first thickness;
providing a photoresist pattern by developing the photoresist layer which is irradiated, using a developer;
providing a first pattern at the first area and a second pattern at the second area by partially etching the substrate; and
removing the remaining photoresist pattern,
wherein
a first opening having a first opening width at the first area, and a second opening having a second opening width which is different from the first opening width at the second area are defined through the phase shift pattern.

13. The patterning method of claim 12, wherein
the first pattern of the substrate has a first width, the second pattern of the substrate has a second width, and
the first width is less than the first opening width, and the second width is less than the second opening width.

14. The patterning method of claim 13, wherein the irradiating light to the photoresist layer using the phase shift mask focuses light passing the first opening in the photoresist layer at the first area, and
focuses light passing the second opening in the photoresist layer at the second area.

15. The patterning method of claim 14, wherein the phase shift pattern of the phases shift mask further comprises chrome oxide nitride (CrOxNy), molybdenum silicide oxide nitride (MoSiOxNy) or a combination of chrome oxide nitride (CrOxNy) and molybdenum silicide oxide nitride (MoSiOxNy).

16. The patterning method of claim 14, wherein
the phase shift pattern further comprises chrome oxide nitride (CrOxNy), and
a difference between the first thickness and the second thickness is about 0.003 times the second height.

17. A method of manufacturing a display panel comprising:
providing a substrate;
disposing a black matrix on the substrate;
disposing a first color filter having a first height on the substrate, a second color filter having a second height and a third color filter having a third height on which the black matrix is disposed;
disposing a conductive layer on the first to third color filters;
disposing a photoresist layer on the conductive layer;
irradiating light to the photoresist layer using a phase shift mask which comprises:
a transparent substrate, and
a phase shift pattern which is provided on the transparent substrate and has a first thickness corresponding to the first color filter and a second thickness corresponding to the second color filter, and a third thickness corresponding to the third color filter;
providing a photoresist pattern by developing the photoresist layer which is irradiated, using a developer; and
providing a first electrode on the first color filter, a second electrode on the second color filter, and a third electrode on the third color filter by partially etching the substrate.

18. The method of claim 17, wherein
the first height of the first color filter is less than the second height of the second color filter, the third height of the third color filter is greater than the second height of the second color filter, and
the first thickness of the phase shift pattern of the phase shift mask is greater than the second thickness, and the third thickness is less than the second thickness.

19. The method of claim 18, wherein
a plurality of first slit openings corresponding to the first color filter, a plurality of second slit openings corresponding to the second color filter and a plurality of third slit openings corresponding to the third color filter are defined through the phase shift pattern,
each of the plurality of first slit openings has a first width, each of the plurality of second slit openings has a second width, and each of the plurality of the third slit openings has a third width,
the first electrode has a first line width, a plurality of slits having a first separation distance is defined in the first electrode, and a first pitch is defined as a sum of the first line width and the first separation distance,
the second electrode has a second line width, a plurality of slits having a second separation distance is defined in the second electrode, and a second pitch is defined as a sum of the second line width and the second separation distance, and
the third electrode has a third line width, a plurality of slits having a third separation distance is defined in the third electrode, and a third pitch is defined as a sum of the third line width and the third separation distance.

20. The method of claim 19, wherein each of the first to third line widths and each of the first to third separation distances is less than about 2 micrometers.

* * * * *